(12) United States Patent
Inoue et al.

(10) Patent No.: US 7,413,791 B2
(45) Date of Patent: Aug. 19, 2008

(54) POLY (PHENYLENE ETHER) RESIN COMPOSITION, PREPREG, AND LAMINATED SHEET

(75) Inventors: Hiroharu Inoue, Hirakata (JP); Eiichiro Saito, Osaka (JP); Hiroaki Fujiwara, Hirakata (JP)

(73) Assignee: Matsushita Electric Works, Ltd., Osaka (JP)

( * ) Notice: Subject to any disclaimer, the term of this patent is extended or adjusted under 35 U.S.C. 154(b) by 439 days.

(21) Appl. No.: 10/718,525

(22) Filed: Nov. 24, 2003

(65) Prior Publication Data

US 2004/0146692 A1  Jul. 29, 2004

(30) Foreign Application Priority Data

Jan. 28, 2003 (JP) ............................. 2003-019475
May 14, 2003 (JP) ............................. 2003-136496

(51) Int. Cl.
C08L 71/12 (2006.01)
(52) U.S. Cl. ..................................................... 428/141
(58) Field of Classification Search .......... 428/141–150
See application file for complete search history.

(56) References Cited

U.S. PATENT DOCUMENTS

| | | | |
|---|---|---|---|
| 4,059,568 A | 11/1977 | Cooper | |
| 4,707,558 A | 11/1987 | Wang et al. | |
| 5,214,099 A | 5/1993 | Khouri et al. | |
| 5,281,667 A | 1/1994 | Khouri et al. | |
| 6,211,327 B1 | 4/2001 | F.M. Braat et al. | |
| 6,352,782 B2 * | 3/2002 | Yeager et al. | 428/461 |
| 6,617,398 B2 | 9/2003 | Yeager et al. | |
| 6,835,241 B2 * | 12/2004 | Tsuchida et al. | 106/287.15 |
| 2001/0053450 A1 | 12/2001 | Yeager et al. | |
| 2001/0053820 A1 | 12/2001 | Yeager et al. | |
| 2002/0028337 A1 | 3/2002 | Yeager et al. | |
| 2002/0169256 A1 | 11/2002 | Merfeld et al. | |
| 2003/0096123 A1 | 5/2003 | Yeager | |

FOREIGN PATENT DOCUMENTS

| | | |
|---|---|---|
| EP | 0529378 | 3/1993 |
| EP | 0558267 | 9/1993 |
| JP | 63-68537 | 3/1988 |
| JP | 2-208355 | 8/1990 |
| JP | 2-233758 | 9/1990 |
| JP | 4-88054 | 3/1992 |
| JP | 4-88055 | 3/1992 |
| JP | 4-88056 | 3/1992 |
| JP | 4-91160 | 3/1992 |
| JP | 6-172468 | 6/1994 |
| JP | 8-231847 | 9/1996 |
| JP | 2002-080503 | 3/2002 |
| JP | 2002-265777 | 9/2002 |
| JP | 2002-308948 | 10/2002 |
| JP | 2004-511580 | 4/2004 |
| WO | 01/40354 | 6/2001 |
| WO | 01/85840 | 11/2001 |
| WO | 02/18493 | 3/2002 |
| WO | 02/072700 | 9/2002 |

OTHER PUBLICATIONS

English Language Abstract of JP 8-231847.
English Language Abstract of JP 2002-080503.
Dwain M. White, The synthesis of 4-Hydroxyarylene Ethers by the Equilibration of Phenols with Poly(2,6-dimylene ether), The Journal of Organic Chemistry, vol. 34, No. 2, pp. 297-303 (1969).
English Language abstract WO 01/40354.
English Language abstract 2-208355.
English Language abstract 4-88056.
English Language abstract 4-88055.
English Language abstract 2-233758.
English Language abstract 4-91160.
English Language abstract 63-68537.
English Language abstract 4-88054.
English Language abstract 6-172468.
English Language abstract 2002-308948.
English Language abstract 2004-511580.

* cited by examiner

*Primary Examiner*—Alicia Chevalier
(74) *Attorney, Agent, or Firm*—Greenblum & Bernstein, P.L.C.

(57) ABSTRACT

An object of the invention is to provide a poly(phenylene ether) resin composition that allows production of laminated sheets excellent in heat resistance and processability, even in case of using a low molecular weight PPE for convenience in prepreg manufacturing without the sacrifice of dielectric characteristics.

The poly(phenylene ether) resin composition according to the present invention comprises poly(phenylene ether) and a crosslinking curing agent, wherein the poly(phenylene ether) is represented by the following formula (I) and the number averaged molecular weight thereof is in the range of 1,000 to 7,000.

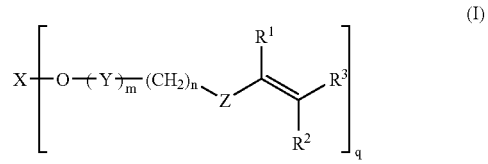

(I)

[wherein, X is an aryl group; $(Y)_m$ is a poly(phenylene ether) moiety; Z is a phenylene group and the like; $R^1$ to $R^3$ each independently is a hydrogen atom, and the like; n is an integer of 1 to 6; and q is an integer of 1 to 4.]

19 Claims, No Drawings

POLY (PHENYLENE ETHER) RESIN COMPOSITION, PREPREG, AND LAMINATED SHEET

BACKGROUND OF THE INVENTION

1. Field of the Invention

The present invention relates to heat-resistant poly(phenylene ether) (hereinafter, referred to as PPE) resin compositions useful as insulation materials for printed wiring boards or the like, prepregs using the PPE resin compositions, and laminated sheets using the prepregs.

2. Description of the Related Art

Recently, along with the progress in technology for integration of semiconductor devices used in electronic devices, higher density electronic packages, and higher density wiring of printed wiring boards, as well as in junction and mounting technologies, there have been continuous advances made in electronic devices, and in particular some startling advances in the electronic devices that uses broadband, such as mobile communication devices.

Printed wiring boards, a constituent for such electronic devices, are heading toward more highly multilayer boards and more concise finer pitch wiring simultaneously. It is effective to reduce the dielectric constant of the materials used therein for raising signal transmission speed to the level needed for acceleration of information processing, and to use materials with a lower dielectric dissipation factor (dielectric loss) for reducing transmission loss.

Accordingly, PPE resins are suitable as a material for the printed wiring boards used in the electronic devices that utilize broadband, as PPE resins have favorable high frequency characteristics (dielectric characteristics) for example in dielectric constant, dielectric loss, and the like. However, PPE resins were not so far sufficiently high in heat resistance and dimensional stability. In addition, these PPE resins carry the disadvantage that they generally have a high melting point, and the use of such a PPE resin for production of prepregs for ordinary multilayer printed wiring boards often resulted in increase in melt viscosity of the prepreg, causing processing defects such as voids and scratches during production of the multilayer sheets and providing multilayer sheets not highly reliable in quality.

PPE resin compositions aimed at improvement in heat resistance and dimensional stability, prepregs using the PPE resin compositions, and laminated sheets using the prepregs were disclosed in Japanese Unexamined Patent Publication No. 8-231847. They are respectively the PPE resin compositions containing PPE, triallyl isocyanurate and nonreactive brominated compound; the prepregs using the PPE resin compositions; and the laminated sheets using the prepregs.

However, when the resin composition described in Japanese Unexamined Patent Publication No. 8-231847 was used, it was difficult to produce multilayer sheets, as the PPE per se has a high melting point and thus the melt viscosity of the resin composition is too high at ordinary heat-pressing temperature to interpose internal conductive patterned layers into the multilayer printed wiring board.

Alternatively, PPE resin compositions comprising a PPE having a smaller molecular weight and thus better fluidity of the melt resin during processing and an improved processability at ordinary heat-press temperature, the prepregs using the PPE resin compositions and the laminated sheet using the prepregs are proposed in Japanese Unexamined Patent Publication No. 2002-265777. The PPE resin compositions described therein was effective in improving the efficiency of producing multilayer sheets.

And U.S. Pat. No. 6,352,782 discloses PPEs, of which the terminal hydroxyl group is capped with the group represented by the following formula. Even though the molecular weight of the PPEs used are not definitely described at all in the EXAMPLEs therein, the number averaged molecular weight of the PPE is described as preferably less than 10,000 and in particular about 300 to 5,000 (still more preferably about 500 to 5,000).

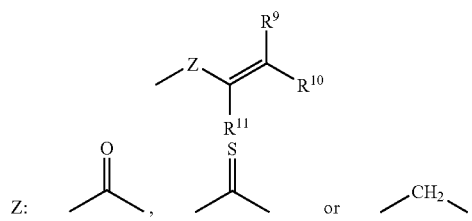

As described above, it is effective to reduce the molecular weight of PPEs in order to raise the fluidity of melt PPE resins and thus the efficiency of prepreg production.

However, the reduction in molecular weight of PPEs is also accompanied with a problem of the decrease in heat resistance of the resulting laminated sheets. Although it may be possible to increase the amount of a crosslinking curing agent, triallyl isocyanurate, for prevention of the decrease in heat resistance, it also accompanies the decrease in relative content of the PPE having excellent dielectric characteristics, making it difficult to produce lower dielectric constant products. Incidentally, the laminated sheets prepared by using the compositions described in Japanese Unexamined Patent Publication No. 2002-265777 above have a dielectric constant of 3.5 to 3.7 (1 MHz) when combined with an E-glass cloth, and of 3.3 to 3.5 (1 MHz) when combined with an NE-glass cloth.

In this context, there exist a need for products having further lower dielectric constant, to cope with the recent drastic increase in the amount of information processed in broadband devices.

BRIEF SUMMARY OF THE INVENTION

The present invention was accomplished considering the environment described above, and an object of the present invention is to provide a poly(phenylene ether) resin composition that can give highly heat resistant laminated sheets using a PPE lower in molecular weight but yet retaining favorable dielectric characteristics, and a prepreg using the same poly(phenylene ether) resin composition. Another object of the present invention is to provide a laminated sheet excellent both in dielectric characteristics and heat resistance.

In order to solve the problems above, the present inventors have conducted intensive studies on the relationship between the structure and dielectric characteristics of these materials by synthesizing various PPEs. As a result, it was found that modification of PPE terminal hydroxyl group with a particular group can raise efficiency of the reaction between PPE and crosslinking curing agent, and that even when a relatively low molecular weight PPE is used for the purpose of increasing the fluidity in a molten state, it is possible to prepare a PPE resin composition excellent in dielectric characteristics and having a higher glass transition temperature without the sacrifice of PPE's inherent characteristics. And using the PPE resin composition, a prepreg and laminated sheet excellent in quality can be produced.

Namely, the poly(phenylene ether) resin composition according to the present invention is a composition comprising a poly(phenylene ether) and a crosslinking curing agent, wherein the poly(phenylene ether) is represented by the following formula (I) and the number averaged molecular weight thereof is in the range of 1,000 to 7,000.

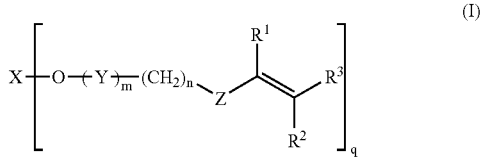

(I)

[wherein, X is an aryl group; $(Y)_m$ is a polyphenylene ether moiety; Z is a phenylene group, an oxygen atom or a sulfur atom; $R^1$ to $R^3$ each independently is a hydrogen atom, an alkyl group, an alkenyl group or alkynyl group; n is an integer of 1 to 6; and q is an integer of 1 to 4.]

DETAILED DESCRIPTION OF THE INVENTION

Hereinafter, embodiments and advantageous effects of the present invention will be described.

The "aryl group" according to the present invention means an aromatic hydrocarbon group. These aryl groups include, for example, phenyl, biphenyl, indenyl, and naphthyl groups, and the preferred aryl group is a phenyl group. In addition, the groups wherein multiple aryl groups are bonded together, for example, those bonded via an oxygen such as a diphenylether group or the like; those bonded via a carbonyl group such as benzophenone group or the like; and those bonded via an alkylene group such as 2,2-diphenylpropane group or the like, are also included in the definition of the aryl group of the present invention. And these aryl groups may be further substituted by one or more substituent(s), such as an alkyl group (preferably, $C_1$-$C_6$ alkyl group; in particular, methyl group), alkenyl group, alkynyl group, halogen atom, or other common substituting group. As the aryl group is bound via an oxygen atom to a poly(phenylene ether) moiety, the upper limit number of the substituting groups depends on the number of the poly(phenylene ether) moiety.

The "poly(phenylene ether) moiety" consists of phenyloxy recurring units and the phenyl group thereof may also be substituted by common substituting groups. Such poly(phenylene ether) moieties include, for example, the compounds represented by the following formula (II).

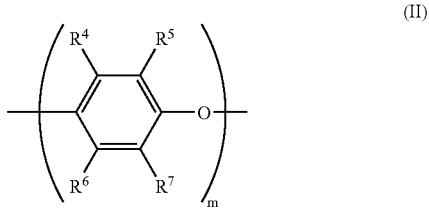

(II)

[wherein, $R^4$ to $R^7$ each independently is a hydrogen atom, an alkyl group, an alkenyl group, an alkynyl group or an alkenyl carbonyl group; and m is an integer of 1 to 100.]

Herein, the presence of unsaturated hydrocarbon-containing groups such as vinyl, 2-propylene (allyl), methacryloyl, acryloyl, 2-propyne (propargyl) groups or the like as side-chains of the poly(phenylene ether) moiety is effective for further raising the operation and effect of the crosslinking curing agent.

Here, m should be adjusted so that the number averaged molecular weight of the poly(phenylene ether) (I) falls in the range of 1,000 to 7,000.

The "alkyl group" means a saturated hydrocarbon group, preferably a $C_1$-$C_{10}$ alkyl group, more preferably a $C_1$-$C_6$ alkyl group, still more preferably a $C_1$-$C_4$ alkyl group, most preferably a $C_1$-$C_2$ alkyl group. Such alkyl groups include, for example, methyl, ethyl, propyl, isopropyl, butyl, isobutyl, sec-butyl, tert-butyl, pentyl, and hexyl groups.

The "alkenyl group" means an unsaturated hydrocarbon group containing at least one carbon-carbon double bond in its structure, and is preferably a $C_2$-$C_{10}$ alkenyl group, more preferably a $C_2$-$C_6$ alkenyl group, most preferably a $C_2$-$C_4$ alkenyl group. These alkenyl groups include, for example, ethylene, 1-propylene, 2-propylene, isopropylene, butylene, isobutylene, pentylene, and hexylene.

The "alkynyl group" means an unsaturated hydrocarbon group having at least one carbon-carbon triple bond in its structure, and is preferably a $C_2$-$C_{10}$ alkynyl group, more preferably a $C_2$-$C_6$ alkynyl group, most preferably a $C_2$-$C_4$ alkynyl group. These alkynyl groups include, for example, ethyne, 1-propyne, 2-propyne, isopropyne, butyne, isobutyne, pentyne, and hexyne.

The "alkenyl carbonyl group" is a carbonyl group substituted with the aforementioned alkenyl group, and is, for example, an acryloyl or methacryloyl group.

In PPE (I), n is preferably an integer of 1 to 4; more preferably, 1 or 2; and most preferably, 1. In addition, q is preferably an integer of 1 to 3; more preferably, 1 or 2; and most preferably, 1. Although m may be an integer of 1 to 100, m should be adjusted according to the number averaged molecular weight of the desired PPE (I), as the number averaged molecular weight of PPE (I) should be at least 1,000 to 7,000 according to the present invention. That is, although the molecular weight of a particular PPE (I) may be less than 1,000 or more than 7,000 according to the value of m, the number averaged molecular weight of entire PPEs (I) contained in the PPE resin composition should be 1,000 to 7,000 according to the present invention, and thus m needs not to be a particular fixed value but may vary in a certain range.

In the following partial structure of PPE (I), it is preferable that Z is a phenylene group and n is 1 (i.e., benzyl derivative), or that Z is an oxygen atom and n is 2, more preferably a p-ethenylbenzyl, m-ethenylbenzyl, or ethenyloxyethyl group.

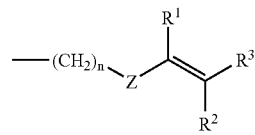

PPEs (I) having these group(s) at the terminal(s) thereof have a particularly favorable interaction with a crosslinking curing agent, and allow production of low-dielectric constant products even without the need for adding a great amount of the crosslinking curing agent. In particular, PPEs having both p-ethenylbenzyl and m-ethenylbenzyl groups at their terminals have low melting and softening points, while those having only p-ethenylbenzyl groups at their terminals have high melting and softening points. Accordingly, it become possible to control the melting and softening points of PPEs arbitrarily by adjusting the ratio of the p-ethenylbenzyl and m-ethenylbenzyl groups.

The number averaged molecular weight of PPE (I) is 1,000 to 7,000. It is because when a PPE having a molecular weight of over 7,000 is used, the decrease in fluidity during processing of the PPE makes multilayer processing more difficult, and when a PPE having a molecular weight of less than 1,000 is used, the resulting prepregs and laminated sheets do not always exhibit the favorable dielectric characteristics and heat resistance inherent to PPE resins. In order to make PPE resins exhibit the excellent fluidity, heat resistance and dielectric characteristics, the number averaged molecular weight thereof is preferably 1,200 and above, 5,000 and below, more preferably 1,500 and above, 4,500 and below.

Additionally, PPE (I) with a smaller molecular weight drastically improves the compatibility thereof with a crosslinking curing agent when they are blended. That is, the smaller the molecular weight of PPE (I), the better the compatibility of the blended components. Accordingly, such lower molecular weight PPEs prevent increase in viscosity due to phase separation, suppress volatilization of the low molecular weight crosslinking curing agent, and thus improve resin hole-filling property into inner via holes (hereinafter, referred to as IVH) particularly. In particular, the blending ratio of PPE (I) to the crosslinking curing agent is preferably 30/70 to 90/10 by mass part. Namely, with the content of PPE (I) at less than 30 mass parts, the laminated sheets prepared may become brittle, while with the content of PPE (I) at more than 90 mass parts (the content of crosslinking curing agent being less than 10 mass parts), the laminated sheets may have a decreased heat resistance.

Hereinafter, the method for producing PPE (I) will be described.

Hitherto, PPEs have been produced by, for example, the method disclosed in U.S. Pat. No. 4,059,568 and the number averaged molecular weight (Mn) thereof is generally 13,000 to 25,000. However, PPEs have inherently a high resin melting point and a melt viscosity, carrying the problems of processing defects when used as the material for multilayer printed wiring boards. So, reduction in molecular weight of the PPEs permits reduction in resin viscosity and improvement in processability.

According to Japanese Unexamined Patent Publication No. 2002-536476 (the contents of which are hereby incorporated by reference), low molecular weight PPEs may be isolated and obtained by a variety of methods but are usually isolated and obtained by precipitation with a suitable reactive agent. As the method for reducing molecular weight of PPEs, may be used the method described in The Journal of Organic Chemistry, 34, 297-303 (1969) (the contents of which are hereby incorporated by reference). This method uses a reaction of a phenol species with PPEs for reduction in molecular weight of the PPEs. The phenol species to be used in this reaction includes phenol, cresol, xylenol, hydroquinone, bisphenol A, 2,6-dimethylphenol, 4,4'-dihydroxydiphenyl ether or the like, but the use of a phenol species having 2 or more functionalities is preferred for improvement in heat resistance of the products after curing. Additionally, as the initiator of the reaction, the use of an oxidizer such as benzoylperoxide, 3,3',5,5'-tetramethyl-1,4-diphenoxyquinone, chloranil, 2,4,6-tri-t-butylphenoxyl, t-butylperoxyisopropyl monocarbonate and azobisisobutyronitrile is preferable, and a metal carboxylate salt may also be added to promote the reaction if desired. In addition, compounds that generate volatile components such as low molecular weight alcohols after the reaction are more preferably used as the initiator for the purpose of suppressing increase in dielectric constant.

The reaction for low molecular weight PPEs is conducted by adding a high molecular weight PPE (common PPE having a number averaged molecular weight of more than 10,000), a phenol species and an initiator in a solvent and heating the mixture. Cobalt naphthenate or the like may be added to the mixture as a catalyst. The solvent use therein is not particularly limited if the solvent can dissolve these components to a suitable extent and does not interfere with the reaction, and, for example, aromatic hydrocarbon solvents such as benzene, toluene or the like may be used as the solvent. The reaction temperature and time may vary according to the number averaged molecular weight or the like of the desired PPEs, but is, for example, at 60 to 100° C. for 30 minutes to 6 hours. These reaction conditions may be determined by conducting preliminary experiments. After the reaction, the low molecular weight PPEs may be used directly in the following reaction processes just by distilling the solvent off under reduced pressure. Alternatively, they may be partially purified by adding a poor solvent for PPEs such as methanol into the reaction mixture and precipitating the desired PPEs.

The PPEs obtained by the reaction above are suitably lower in molecular weight by the cleavage of polymer backbones during the reaction, and contain an aryl group derived from the phenol species used at one end and a hydroxyl group at the other end represented by the following formula. In the formula, the number of poly(phenylene ether) moieties per phenol species, i.e., q, is dependent on the number of hydroxyl groups in the phenol species used. That is, when the phenol species has only one hydroxyl group, q is 1, and when a polyvalent phenol is used as the phenol species, q becomes 2 or more.

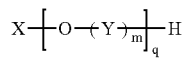

[wherein, X, (Y)$_m$, and q have the same meanings as described above.]

Subsequently, the terminal hydroxyl groups are capped according to the following reaction formula.

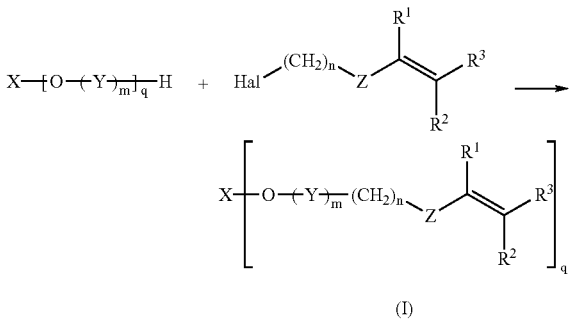

[wherein, X, (Y)$_m$, Z, $R^1$ to $R^3$, m, n, and q have the same meanings as described above; and, Hal represents a chlorine or bromine atom.]

In the reaction above, the terminal hydroxyl groups are capped by reacting the PPE obtained by the lowering molecular weight reaction above with a halogenated compound such as chloromethylstyrene or the like in the presence of a base in a solvent. An alkali metal hydroxide such as sodium hydroxide or the like may be used as the base. In such a case, a base such as an aqueous sodium hydroxide solution is added to a solution of a low molecular weight PPE in a solvent such as toluene or the like, and quaternary ammonium salt (e.g., tetra-n-butylammonium bromide) may additionally added as a phase transfer catalyst to promote the reaction. The reaction temperature and time may mainly vary according to the kind of compounds used, and is, for example, at room temperature to 100° C. for 30 minutes to 10 hours. After the reaction, the desired product can be obtained by precipitating the product by adding a poor solvent for the desired product, for example, water, a lower alcohol such as methanol or the like; filtering; washing with the same solvent; and drying.

The inventive PPEs thus obtained, as they are lower in molecular weight, provide PPE resin compositions excellent in fluidity. In addition, as the PPEs can be easily cured with a relatively small amount of crosslinking curing agent, the use of the PPEs according to the present invention in an amount as much as allows can improve dielectric characteristics of the resulting PPE resin compositions and retain the PPE's inherent characteristics such as heat resistance and the like.

The crosslinking curing agent added to the PPE resin composition of the present invention is primarily for crosslinking the poly(phenylene ether)s of the present invention described above three dimensionally. And even when the low molecular weight poly(phenylene ether) is used in the PPE resin compositions for increasing fluidity, the crosslinking curing agent can retain heat resistance or the like of the PPE resins. Crosslinking curing agents excellent in compatibility with PPEs are especially used as the crosslinking curing agent in the present invention, and preferable examples thereof include, multifunctional vinyl compounds such as divinylbenzene, divinylnaphthalene, divinylbiphenyl or the like; vinylbenzylether compounds prepared in the reaction of phenol and vinylbenzylchloride; allylether compound prepared in the reaction of styrene monomer, phenol and allylchloride; and trialkenylisocyanurates. In particular, trialkenyl isocyanurates that are excellent in compatibility are favorable, and among them, triallylisocyanurate (hereinafter, TAIC) and triallylcyanurate (hereinafter, TAC) are preferred. It is because these two crosslinking curing agents give laminated sheets having a lower dielectric constant and excellent in heat resistance and reliability.

Alternatively, the use of a (meth)acrylate compound (methacrylate or acrylate compound) as the crosslinking curing agent of the present invention is also favorable. And in particular, the use of a tri- to penta-functional (meth)acrylate compound in an amount of 3 to 20 mass % with respect to the total amount of PPE resin composition is preferred. As the tri- to penta-functional methacrylate compound, trimethylolpropane trimethacrylate (TMPT) or the like may be used, while trimethylolpropane triacrylate or the like may be used as the tri- to penta-functional acrylate compound. Addition of these crosslinking curing agents further increases the heat resistance of the laminated sheets finally obtained.

While (meth)acrylate compounds having functional groups fewer or more than 3 to 5 may be used, the use of tri- to penta-functional (meth)acrylate compounds increases the heat resistance of the resulting laminated sheet to the larger extent. Even when a tri- to penta-functional (meth)acrylate compound is used, the use of this compound in an amount of less than 3 mass % with respect to the total amount of the PPE resin composition may not provide the final laminated sheets with sufficient heat resistance, while the use in an amount of more than 20 mass % may reduce the dielectric characteristics and humidity resistance of the final laminated sheets.

The blending ratio of PPE to the crosslinking curing agent is preferably 30/70 to 90/10 by mass part. Only less than 30 mass parts of the PPE may make the laminated sheets more brittle, while the presence of the PPE at more than 90 mass parts may reduce the heat resistance thereof. Namely, in order to prevent decrease (difficulty) in resin hole-filling property into IVH due to compatibility that depends on the molecular weight of PPE and on the blending ratio of PPE to a crosslinking curing agent such as triallylisocyanurate, the blending ratio of PPE to crosslinking curing agent may be determined as described above in the present invention. In addition, a blending ratio of PPE to crosslinking curing agent in this specified range allows improvement in fluidity and compatibility of the PPE resin compositions and at the same time improvement in dielectric characteristics of the PPE resins obtained. The blending ratio of PPE to crosslinking curing agent is preferably 50/50 to 90/10, more preferably 60/40 to 90/10.

In addition, the use of the above mentioned PPE combined with an unmodified PPE having a number averaged molecular weight of 9,000 to 18,000 in the PPE resin composition according to the present invention allows further improvement in fluidity control and heat resistance of the PPE resin composition concerned in the present invention. Additionally, it also suppresses precipitation of additive components such as filler and the like in the composition. Incidentally, the unmodified PPEs are poly(phenylene ether)s having no unsaturated carbon-carbon groups in the molecule, and the blending amount thereof is preferably 3 to 70 mass parts with respect to the total amount of PPE and the crosslinking curing agent.

Further, in order to improve heat resistance, adhesive property, and dimensional stability, at least one compatibilizer selected from the group consisting of styrene-butadiene block copolymers, styrene-isoprene block copolymers, 1,2-polybutadiene, 1,4-polybutadiene, maleic acid-modified polybutadiene, acrylic acid-modified polybutadiene, and epoxy-modifed polybutadiene may be used if desired in addition to this PPE.

The PPE resin composition according to the present invention may further comprise, if desired, inorganic and organic fillers. The inorganic filler can be used for suppressing the thermal expansion coefficient and improving the toughness of the laminated sheets prepared from the PPE resin composition of the present invention. The inorganic filler to be used is not particularly limited, but metal oxides, nitrites, silicides, borides or the like such as silica, boron nitride, wollastonite, talc, kaolin, clay, mica, alumina, zirconia, such as titania, etc. are exemplified. The PPE resin composition according to the present invention is effective for reducing dielectric constant, and thus the use of low-dielectric constant fillers such as silica and boron nitride is preferred as the inorganic filler.

On the other hand, organic fillers are used primarily for the purpose of reducing the dielectric constant of laminated sheets prepared from the PPE resin compositions of the present invention. Specifically, fluorine-based, polystyrene-based, divinylbenzene-based, polyimide-based fillers or the like are exemplified, and these fillers each may be used alone or in combination. Examples of the fluorine-based fillers (fillers made of fluorine-containing compounds) include polytetrafluoroethylene (PTFE), polyperfluoroalkoxy resins, polyethylenefluoride-propylene resins, polytetrafluoroethylene-polyethylene copolymers, polyvinylidene fluoride, polychlorotrifluoroethylene resins or the like. These inorganic and organic fillers each may be used alone or in combination.

The aforementioned fillers should be pulverized into particles smaller in size for the purpose of improving insulation characteristics and reliability to cope with a recent trend toward lighter, thinner, shorter, and smaller products and high-density mounting. More specifically, the fillers are preferably fine particles having a average diameter of not more than 10 μm. Such fillers allow production of laminated sheets excellent in evenness and reliability. The "average diameter" is not necessarily determined but may be decided by the brochure about the filler. Most of the fillers currently available are fine particles having an average diameter of 0.05 μm or more, and thus the lower limit of the average diameter of fillers is essentially this value.

The inorganic and organic fillers used for the PPE resin composition according to the present invention may be hollow or porous particles, or particles made of a fluorine-containing compound for the purpose of further reducing the dielectric constant of the products. It is because these fillers allow production of laminated sheets excellent in dielectric constant.

In the case of inorganic hollow particles, the sintering temperature thereof is important and preferably 600° C. or more. When the hollow particles are prepared by the sol-gel method or the like, such hollow particles may deteriorate dielectric characteristics, and in particular raise dielectric dissipation factor due to residual silanol groups thereon and may drastically deteriorate broadband characteristic.

In the case of organic fillers, the hollow polymeric fine powders disclosed in Japanese Unexamined Patent Publication No. 2002-80503 (the contents of which are hereby incorporated by reference) are useful. The shell for the hollow particles is made of a low-dielectric constant material such as divinylbenzene or divinylbiphenyl, which is advantageous for producing laminated sheets having a low-dielectric constant.

The PPE resin compositions according to the present invention may further contain, if desired, a flame retardant for the purpose of increasing the water resistance, humidity resistance, heat and moisture resistance, and glass transition point of laminated sheets. In such a case, in a varnish consisting of the PPE resin composition containing the PPE, a crosslinking curing agent and a flame retardant; and a solvent (organic solvent), the aforementioned flame retardant is preferably a bromine compound that is nonreactive to the PPE and the crosslinking curing agent and not soluble but dispersed in the solvent used for the varnish. Namely, when the flame retardant is a reactive flame retardant having unsaturated bonds, or a flame retardant soluble in the aforementioned solvent, the flame retardant is incorporated into the reaction system for production of the matrix resin, consequently reducing the water resistance, humidity resistance, heat and moisture resistance and glass transition point (hereinafter, referred to as Tg) of the prepreg using this resin composition and the laminated sheet using the prepreg. Therefore, when the flame retardant is a brominated organic compound nonreactive with PPE and the crosslinking curing agent and is not soluble but dispersed in the solvent, the flame retardant seemingly remains in the resin as a filler, improving the water resistance, humidity resistance, heat and moisture resistance and Tg of the products. In addition, the true specific gravity of the brominated organic compound is preferably in the range of 2.0 to 3.5. When the true specific gravity of the flame retardant, a brominated organic compound, is less than 2.0, the flame retardant can be hardly dispersed, while when the specific gravity is over 3.5, the flame retardant tends to sediment in the varnish of the PPE resin composition and requires continuous stirring to keep the varnish homogenous, thus reducing operational efficiency.

As such a brominated organic compound, an aromatic bromine compound is preferable, and suitable examples thereof include decabromodiphenyl ethane, 4,4-dibromobiphenyl, ethylene bistetrabromophthalimide, or the like. The brominated organic compound is preferably contained in such an amount that the content of bromine falls in the range of 8 to 20 mass % with respect to the total amount of the resin composition. When the content of bromine is less than 8 mass % with respect to the total amount of the resin composition, the laminated sheets have a declined flame resistance and cannot retain the flame resistance at the level of UL Standard 94V-0, while when the content exceeds 20 mass %, the laminated sheets have a declined heat resistance and release bromine (Br) more easily when the laminated sheets are heated.

In addition, the PPE resin composition according to the present invention may further comprise a reaction initiator for the purpose of enhancing the advantageous effect of the crosslinking curing agent. Although the presence of PPE (I) and a crosslinking curing agent alone can advance curing at high temperature, it is desirable to add the reaction initiator as it is sometimes difficult to keep high temperature until the curing is completed depending on the process conditions. The "reaction initiator" is not particularly limited if it can accelerate curing of the PPE resin compositions at a suitable temperature and within a suitable period, and increase the characteristics such as heat resistance or the like of the PPE resin; and examples thereof are oxidizers such as $\alpha,\alpha'$-bis(t-butylperoxy-m-isopropyl)benzene, 2,5-d imethyl-2,5-di(t-butyl peroxy)-3-hexyne, benzoylperoxide, 3,3',5,5'-tetramethyl-1,4-diphenoxyquinone, chloranil, 2,4,6-tri-t-butyiphenoxyl, t-butylperoxyisopropyl monocarbonate, azobisisobutyronitrile. And if desired, the curing reaction may further accelerated by further adding a metal carboxylate salt. Among them, $\alpha,\alpha'$-bis(t-butylperoxy-m-isopropyl)benzene is particularly preferable as the reaction initiator. It is because the compound has a relatively high reaction initiation temperature, thus not initiating curing when the curing is not required, for example, during prepreg drying, and not impairing the storage stability of the PPE resin compositions; a low volatility, preventing vaporization during prepreg drying and storage; and thus an excellent stability.

As described above, the PPE resin composition according to the present invention requires PPE (I) and a crosslinking curing agent as essential components; preferably contains one or more components selected from the group consisting of unmodified PPEs, fillers, flame retardants, and reaction initiators; and further contains common additives to the PPE resin compositions for use in production of electronic devices (particularly, printed wiring boards).

The PPE resin composition according to the present invention is first prepared as a varnish, by adding a PPE, an crosslinking curing agent, and the other additive components if desired to an organic solvent, for producing prepregs by impregnating the vanish into substrates. The organic solvent is not particularly limited if it do not dissolve the aforementioned brominated organic compound but dissolves the resin component and does not impair the reaction; and suitable solvents include, for example, ketones such as methylethylketone or the like, ethers such as dibutylether or the like, esters such as ethyl acetate or the like, amides such as dimethylformamide or the like, aromatic hydrocarbons such as benzene, toluene, xylene or the like, and chlorinated hydrocarbons such as trichloroethylene or the like; each solvent can be used alone or in combination thereof. The concentration of resin solid matter in the varnish may be changed suitably according to the process for impregnating the varnish into substrates, and is, for example, suitably 40 to 90 mass %.

Prepregs are produced by impregnating the varnish prepared as described above into substrates and heat-drying the same to remove the organic solvent and partially curing the resins in the substrates. As the substrate, any woven or unwoven fabrics made of known organic or glass fibers may be used, but the substrate is preferably an NE-type glass cloth, and the use thereof provides prepregs and laminated sheets lower in dielectric constant and dielectric dissipation factor and better in high frequency characteristics. Here, the "NE-type glass cloth" is a glass cloth having a low dielectric constant. Namely, glass cloths made of NE glasses having a dielectric constant ($\epsilon$: 4.4) lower than that ($\epsilon$: 6.5) of the ordinary E glasses are called "NE-type glass clothes". The term, "NE", represents "New E-type glass".

The amount of the varnish impregnated into the above substrate is preferably at such an amount that the mass content of the resin solid mass in the prepreg is 35 mass % or more. The dielectric constant of the substrates is generally higher than that of the resins, and thus in order to decrease the dielectric constant of the laminated sheets prepared from these prepregs, the content of the resin component in the prepreg is preferably higher than the aforementioned mass content. For example, the prepregs prepared from an E glass cloth (substrate) containing a resin at a resin component content of 37 mass % or more can have a dielectric constant of as low as 3.5 or less, while those prepared from an NE glass cloth containing a resin at a resin content of 45 mass % or more can have a dielectric constant as low as 3.3 or less. In addition, the condition for heating the substrates impregnated with the varnish is, for example, 80 to 150° C. for 1 to 10 minutes, but is not restricted thereto.

In the present invention, laminated sheets may be produced using the aforementioned prepregs. More specifically, multi-layered and integrated laminated sheets having a metal foil on one side or two metal foils on both faces can be produced by stacking one or multiple sheets of the prepregs according to the present invention, placing on one or both sides metal foils such as copper foil or the like, and heat-pressing the resulting stack. Etching of the metal foils on the surface of the laminated sheets to form a wiring pattern provides printed wiring boards. Further, multilayer printed wiring boards can be prepared by using this printed wiring boards as internal layer printed wiring boards, providing a surface treatment to the metal foils thereon, stacking multiple sheets thereof while interposing a sheet of the prepreg of the present invention between them, laying metal foils on the utmost faces of the stack, and heat-pressing the resulting entire stack. The heat-pressing condition may vary according to the blending ratio of raw materials used for production of the PPE resin compositions according to the present invention and is not particularly limited, but these stacks are preferably heat-pressed under a condition of a temperature in the range of 170° C. to 230° C. and a pressure in the range of 1.0 MPa to 6.0 MPa (10 kg/cm$^2$ to 60 kg/cm$^2$) for a suitable period. The laminated sheets and printed wiring boards obtained in this manner are excellent in high-frequency such as dielectric characteristics or the like without the sacrifice of the characteristics inherent to PPES, and are at the same time improved in processability, water resistance, humidity resistance, moisture and heat resistance, and glass transition point.

Further, the use of copper foils for production of the laminated sheets according to the present invention having a surface roughness of 0 μm to 2 μm; the surface thereof on which a resin layer is to be formed with a prepreg (surface contacting with prepreg) being treated with zinc or a zinc alloy for corrosion prevention and improvement in adhesiveness with the resin layer, and additionally treated with a coupling agent such as a vinyl group-containing silane coupling agent, allows production of printed wiring boards higher in adhesion strength between the resin layer (insulation layer) and the circuit (copper foil) and better in high-frequency characteristics. For the treatment of copper foils with zinc or a zinc alloy, zinc or the zinc alloy may be deposited onto the surface of the copper foil by means of, for example, plating.

Accordingly, the prepregs obtained by impregnating the PPE resin composition according to the present invention into substrates and heat-drying and semi-curing the impregnated substrates, and the laminated sheet obtained by stacking and heat-pressing a predetermined number of the prepregs are excellent in processability, water resistance, humidity resistance, moisture and heat resistance, and glass transition point; and the prepregs exhibit an excellent processability when used for production of multilayer printed wiring boards. In addition, the laminated sheets according to the present invention for production of printed wiring boards provides the printed wiring boards that are lower in dielectric constant and dielectric dissipation factor, higher in water resistance, humidity resistance, moisture and heat resistance, higher in glass transition point, improved in adhesion strength, and excellent in high frequency characteristic. Alternatively, the use of the prepregs according to the present invention as a laminated sheet for production of multilayer printed wiring boards provides the multilayer printed wiring boards having no voids or scratches generated during the multilayer processing, excellent in processability, lower in dielectric constant and dielectric dissipation factor, superior in water resistance, humidity resistance, moisture and heat resistance, higher in glass transition point, better in adhesion strength, and improved in high frequency characteristics.

Hereinafter, the present invention will be described in more detail with reference to Examples.

EXAMPLES

Preparation of Low Molecular Weight PPE (PPE-1)

First of all, the molecular weight of a PPE was adjusted.

36 Mass parts of a PPE (GE PLASTICS Japan Ltd.; brand name: "Noryl PX9701"; number averaged molecular weight: 14,000), 1.54 mass parts of 2,6-dimethylphenol as a phenol species, 1.06 mass parts of t-butylperoxyisopropyl monocarbonate (NOF Corporation; brand name; "Perbutyl I") as an initiator, and 0.0015 mass parts of Cobalt naphthenate were mixed and blended. To the mixture, 90 mass parts of toluene was added as a solvent, and the resulting mixture was stirred at 80° C. for 1 hour to disperse or dissolve the ingredients. After the reaction was completed, the PPE thus prepared was reprecipitated by adding a large amount of methanol, and after removal of impurities, dried under reduced pressure at 80° C. for 3 hours to remove the solvent completely. The PPE obtained after this step had a number averaged molecular weight of about 2,400 as determined by gel permeation chromatography (GPC).

Subsequently, the terminal hydroxyl group of the low molecular weight PPE (number averaged molecular weight: about 2,400) was capped with an ethenylbenzyl group. Into a 1-liter three-necked flask equipped with a temperature controller, stirring equipment, cooling equipment, and a dropping funnel, were added 200 g of the low molecular weight PPE (number averaged molecular weight: about 2,400), 14.51 g of chloromethylstyrene (50/50 mixture of p-chloromethylstyrene and m-chloromethylstyrene; Tokyo Kasei Kogyo Co., Ltd.), 0.818 g of tetra-n-butylammonium bromide, and 400 g of toluene. And the mixture was stirred until complete dissolution and heated to 75° C. The mixed solution was added dropwise with an aqueous sodium hydroxide solution (11 g of sodium hydroxide/11 g of water) over the period of 20 minutes and stirred at 75° C. for additional 4 hours. Then, the solution in the flask was neutralized with a 10% aqueous hydrochloric acid solution, and added with a large amount of methanol to reprecipitate the ethenylbenzylated modified PPE, and the PPE was collected by filtration. The collected PPE was washed three times with a mixed solution of methanol and water at the ratio of 80 to 20, and dried under reduced pressure at 80° C. for 3 hours to give an ethenylbenzylated modified PPE containing no solvent or water. The modified PPE had a number averaged molecular weight of about 2,700 as determined by gel permeation chromatography. Hereinafter, the PPE thus obtained will be referred to as "PPE-1".

Preparation of Low Molecular Weight PPE (PPE-2)

First of all, the molecular weight of a PPE was adjusted. 36 mass parts of a PPE (GE PLASTICS Japan Ltd.; brand name: "Noryl PX9701"; number averaged molecular weight: 14,000), 1.44 mass parts of bisphenol A as a phenol species, and 1.90 mass parts of benzoyl peroxide (NOF Corporation: brand name "Nyper BW") as an initiator were respectively blended. To the mixture was added 90 mass parts of toluene as a solvent, and the mixture was stirred at 80° C. for 1 hour to disperse or dissolve the ingredients. After the reaction was completed, the PPE thus prepared was reprecipitated by adding a large amount of methanol, and after removal of impurities, dried under reduced pressure at 80° C. for 3 hours to remove the solvent completely. The PPE obtained after this step had a number averaged molecular weight of about 2,400 as determined by gel permeation chromatography (GPC).

Subsequently, the low molecular weight PPE (number averaged molecular weight: about 2,400) was ethenylbenzylated in a similar manner to the "Preparation of PPE-1" above to give a modified PPE. The modified PPE had a number averaged molecular weight of about 2,800 as determined by gel permeation chromatography. Hereinafter, the PPE thus obtained will be referred to as "PPE-2".

Preparation of Low Molecular Weight PPE (PPE-3)

Using a low molecular weight PPE of Asahi Kasei Corporation having a number averaged molecular weight (Mn) of 2,100 and a ratio of weight average molecular weight (Mw) to number averaged molecular weight (Mn), (Mw/Mn), of 1.6, the terminal hydroxyl group thereof was ethenylbenzylated in a similar manner to the "Preparation of PPE-1" above to give a modified PPE. The modified PPE had a number averaged molecular weight of about 2,500 as determined by gel permeation chromatography. Hereinafter, the PPE thus obtained will be referred to as "PPE-3".

Preparation of Low Molecular Weight PPE (PPE-4)

Using a low molecular weight PPE of Asahi Kasei Corporation having a number averaged molecular weight (Mn) of 2,100 and a ratio of weight average molecular weight (Mw) to number averaged molecular weight (Mn), (Mw/Mn), of 1.6, the terminal hydroxyl group thereof was ethenyloxyethylated using 2-chloroethylethenylether instead of chloromethylstyrene in the "Preparation of PPE-1" to give a modified PPE. The modified PPE had a number averaged molecular weight of about 2,500 as determined by gel permeation chromatography. Hereinafter, the PPE thus obtained will be referred to as "PPE-4".

Preparation of Low Molecular Weight PPE (PPE-5)

Using a low molecular weight PPE of Asahi Kasei Corporation having a number averaged molecular weight (Mn) of 2,100 and a ratio of weight average molecular weight (Mw) to number averaged molecular weight (Mn), (Mw/Mn), of 1.6, the terminal hydroxyl group thereof was p-ethenylbenzylated using p-chloromethylstyrene (CMS-14, Seimi Chemical Co., Ltd.) instead of the 50/50 mixture of p-chloromethylstyrene and m-chloromethylstyrene in the "Preparation of PPE-1" above to give a modified PPE. The modified PPE had a number averaged molecular weight of about 2,500 as determined by gel permeation chromatography. Hereinafter, the PPE thus obtained will be referred to as "PPE-5".

Preparation of Low Molecular Weight PPE (PPE-6)

Using a low molecular weight PPE of Asahi Kasei Corporation having a number averaged molecular weight (Mn) of 3,500 and a ratio of weight average molecular weight (Mw) to number averaged molecular weight (Mn), (Mw/Mn), of 1.9, the terminal hydroxyl group thereof was ethenylbenzylated in a similar manner to the "Preparation of PPE-1" to give a modified PPE. The modified PPE had a number averaged molecular weight of about 4,200 as determined by gel permeation chromatography. Hereinafter, the PPE thus obtained will be referred to as "PPE-6".

Example 1

70 Mass parts of an ethenylbenzylated low molecular weight PPE, "PPE-1", and 100 mass parts of toluene used as a solvent were mixed and stirred at 80° C. for 30 minutes until complete dissolution. To the PPE solution thus obtained, 30 mass parts of TAIC (Nippon Kasei Chemical Co., Ltd.) as a crosslinking curing agent, 20 mass parts of a brominated organic compound, decabromodiphenyl ethane (Albemarle Asano Corporation; brand name: "SAYTEX 8010", Br-content: 82 wt %) as a flame retardant, and 2.5 mass parts of α,α'-bis(t-butylperoxy-m-isopropyl)benzene (NOF Corporation; brand name: "Perbutyl P") as a reaction initiator were added. Additionally, 14 mass parts of spherical silica (Denki Kagaku Kogyo Kabushiki Kaisha; brand name: "FB3SDC") was added thereto as an inorganic filler, and the mixture was mixed, dispersed, and dissolved in a solvent (toluene) to give a resin composition, varnish. As the flame retardant is a brominated organic compound nonreactive with PPE and TAIC, the flame retardant was not completely dissolved and dispersed in the resin composition, varnish.

Subsequently, the varnish was impregnated into an NE-type glass cloth (Nitto Boseki Co., Ltd.; brand name: "NEA 2116"), and the impregnated cloth was heated and dried under a condition of a temperature of 120° C. and a period of 3 minutes to remove the solvent to give a prepreg having a resin content of 55 mass % (sample (i)).

On both faces of a sheet of this prepreg, two copper foils (ST foil) having a thickness of 35 μm were placed, and heat-pressed under a condition of a temperature of 200° C. and a pressure of 3.0 MPa (30 kg/cm$^2$) for 180 minutes to give a double-sided copper-clad laminate for use as an internal layer printed wiring boards. Then, after a wiring pattern was formed on the double-sided copper-clad laminate for use as an internal layer printed wiring board, the surface of copper foils was blackened to give core printed wiring boards. The two core printed wiring boards were piled together, between the two core printed wiring boards and on their both surface, the three prepregs were placed respectively. And additionally two sheets of copper foils (ST foil) having a thickness of 35 μm were placed on the utmost outer layers of the resulting stack. The resulting multi-layered stack was then heat-pressed under a condition of a temperature of 200° C. and a pressure of 3.0 MPa (30 kg/cm$^2$) for 180 minutes to give a 6-layered copper-clad laminate for use as a printed wiring board. Subsequently, the 6-layered copper-clad laminate thus obtained was cut into pieces with a dimension of 50 mm×50 mm, and the outer copper foil layers thereof were removed by etching to give samples for evaluation of the heat resistance, moisture resistance and processability of the 6-layered board. The 6-layered boards were cut to be 100 mm×10 mm pieces, and they were used as samples for evaluation of the adhesion strength of the internal layer copper foil (sample (ii)).

Separately, 7 sheets of prepregs were piled together and two copper foils (ST foil) having a thickness of 35 μm were place on the top and bottom surfaces of the stack. The resulting stack was heat-pressed under a condition of a temperature of 200° C. and a pressure of 3.0 MPa (30 kg/cm$^2$) for 180 minutes to give double-sided copper-clad laminates for use as printed wiring boards. Then, the double-sided copper-clad laminates thus obtained were cut into pieces with a diameter of 100 mm×10 mm to give samples for evaluating copper foil adhesion strength, and pieces with a diameter of 86 mm×86 mm, on which a wiring pattern was formed, to give samples for measurement of dielectric constant and dielectric dissipation factor. Further, the copper foils on both surface thereof were remove by etching, giving samples for evaluation of glass transition point (Tg), thermal expansion coefficient, flame resistance, and hygroscopicity (sample (iii)).

Separately, through holes having a drilling diameter of 0.25 mm were made in FR-4 substrates having a thickness of 1.6 mm. After the through holes were plated to a 20 μm thickness, two prepregs and then two copper foils atop thereof were stacked on both faces of the substrate, and the stack was heat-pressed under a condition of a temperature of 200° C. and a pressure of 3.0 MPa (30 kg/cm$^2$) for 180 minutes. The resulting sheets were used as the sample boards for evaluation of resin hole-filling property into IVH (sample (iv)).

After a wiring pattern is formed on one side of the double-sided copper-clad laminates prepared in the step for preparing sample (ii) for use as internal layer printed wiring board, a sheet of prepreg and the same copper foil as used for making the double-sided copper-clad laminates were stacked on the side, on which the wiring pattern was formed, and the stack was heat-pressed under the same condition to give multilayer printed wiring boards having strip lines (sample (v)).

Examples 2 to 9

By using the ingredients in the composition shown in Tables 1 and 2, prepregs and samples (i) to (v) were prepared in a similar manner to EXAMPLE 1. Incidentally, the unmodified PPE having a number averaged molecular weight of about 9,000, which was added in EXAMPLE 9, was prepared by the molecular degrading technique described above from a PPE (GE PLASTICS Japan Ltd.: brand name "Noryl PX9701") having a number averaged molecular weight of 14,000.

Comparative Examples 1 and 2

By using the ingredients in the composition shown in Table 2, prepregs and samples (i) to (v) were prepared in a similar manner to EXAMPLE 1.

The materials used in Tables 1 and 2 are as follows:
Unmodified PPE: "Noryl PX9701", GE PLASTICS Japan Ltd. (Mn: about 14,000)
Crosslinking curing agent 1: Triallyl isocyanurate (TAIC)
Crosslinking curing agent 2: Trimethylolpropane trimethacrylate (TMPT, Shin Nakamura Chemical Co., Ltd.; "NKester TMPT")
Reaction initiator: α,α'-bis(t-butylperoxy-m-isopropyl)benzene (NOF Corporation; brand name: "Perbutyl P")
Flame retardant: Decabromodiphenylethane (Albemarle Asano Corporation; brand name: "SAYTEX 8010", Br content: 82 wt %)
Inorganic filler (spherical silica): Denki Kagaku Kogyo Kabushiki Kaisha, "FB3SDC"
The copper foil used had a surface roughness of 6 μm (Japan Energy Corporation; "JTW"). In addition, the surface of the copper foil was plated with zinc or a zinc alloy and additionally treated with a coupling agent.

Experimental Example

The resin content and resin fluidity of prepregs were measured using samples (i) prepared in EXAMPLEs 1 to 9 and COMPARATIVE EXAMPLEs 1 and 2; the glass transition point (Tg), dielectric constant, dielectric dissipation factor, thermal expansion coefficient, flame resistance, copper foil adhesion strength, and hygroscopicity, samples (iii) above; the secondary processability, solder heat resistance after moisture absorption, and internal layer copper foil adhesion strength, samples (ii) above; the resin hole-filling property into IVH, samples (iv) above; and the transmission loss, samples (v) above.

The resin content and resin fluidity of prepregs were measured according to JIS (C6521); the dielectric constant, dielectric dissipation factor, copper foil adhesion strength of laminated sheets, JIS (C6481); the thermal expansion coefficient (z-axis), TMA method; the flame resistance, UL94 Standard; and the glass transition point (Tg), by using a viscoelasticity spectrometer. The secondary processability was determined by visual observation, based on the presence of the voids and scratches, after the outer layer copper foil previously subjected to secondary processing was removed by etching. The internal layer copper foil adhesion strength was the adhesion strength of the blackened surface.

The hygroscopicity was determined under a condition of E-24/50+C-24/60/95. That is, the hygroscopicity was measured after the samples were dried at 50° C. for 24 hours, cooled to 23° C. for 24 hours, and stored at 95% relative humidity at 60° C. for 24 hours. Laminated sheet samples cut into pieces having a dimension of 50 mm×50 mm after the surface thereof was removed by etching were used for hygroscopicity measurement.

The solder heat resistance after moisture absorption was determined in the following manner: first, the 50 mm×50 mm 6-layered copper-clad laminate samples were treated under D-2/100, i.e., boiled at 100° C. for 2 hours and subjected to the Pressure Cooker test (PCT) wherein the samples were treated at 135° C. under 2 atom (0.2 MPa) for 2 hours, respectively; 5 pieces of the samples were immersed in liquid solder at 260° C. for 20 seconds; and the degree of measling and blister was determined by visual observation. The resin hole-filling property into IVH was determined in the following way: samples were first subjected to 300 cycles of heating and cooling in the heat cycle test (condition B); the presence of voids and scratches were determined by visual observation of the cross-section of the resin filled in IVH. The transmission loss was determined by measuring the transmission loss when 1.6 GHz signals were applied to the internal layer circuit of the multilayer printed wiring boards.

The results from the measurements above are summarized in Tables 1 and 2.

TABLE 1

| | | | EXAMPLE | | | | |
|---|---|---|---|---|---|---|---|
| | | | 1 | 2 | 3 | 4 | 5 |
| PPE Resin Varnish | PPE-1 | Mass Part | 70 | 0 | 70 | 0 | 0 |
| | | Mn | 2700 | — | 2500 | — | — |
| | PPE-2 | Mass Part | 0 | 70 | 0 | 0 | 0 |
| | | Mn | — | 2800 | — | — | — |
| | PPE-3 | Mass Part | 0 | 0 | 0 | 70 | 0 |
| | | Mn | — | — | — | 2500 | — |
| | PPE-4 | Mass Part | 0 | 0 | 0 | 0 | 70 |
| | | Mn | — | — | — | — | 2500 |
| | Crosslinking Curing Agent 1 | kind | TAIC | TAIC | TAIC | TAIC | TAIC |
| | | Mass Part | 30 | 30 | 20 | 30 | 30 |
| | Crosslinking Curing Agent 2 | kind | — | — | TMPT | — | — |
| | | Mass Part | — | — | 10 | — | — |
| | Reaction Initiator | Mass Part | 2.5 | 2.5 | 2.5 | 2.5 | 2.5 |
| | Flame Retardant | Mass Part | 20 | 20 | 20 | 20 | 20 |
| | Inorganic Filler | Mass Part | 14 | 14 | 14 | 14 | 14 |
| | | av. Diamter (μm) | 3 | 3 | 3 | 3 | 3 |
| Cu Foil Prepreg | Surface Roughness | μm | 6 | 6 | 6 | 6 | 6 |
| | Resin Content | % | 55 | 55 | 55 | 55 | 55 |
| | Resin Fluidity | % | 15 | 15 | 13 | 15 | 15 |
| Laminated Sheet | Tg | °C. | 218 | 222 | 236 | 230 | 225 |
| | Dielectric Constant | | 3.15 | 3.15 | 3.15 | 3.14 | 3.15 |
| | Dielectric Dissipation Factor | | 0.0015 | 0.0015 | 0.0015 | 0.0015 | 0.0015 |
| | Thermal Expansion Coeff. (Z-axis) | ppm/°C. | 59 | 59 | 59 | 59 | 61 |
| | Flame Resistance | UL Standard | V-0 | V-0 | V-0 | V-0 | V-0 |
| | Cu Foil Adhesion Strength | kN/m | 1.45 | 1.45 | 1.45 | 1.62 | 1.62 |
| | Sec. Processability | | OK | OK | OK | OK | OK |
| | Moisture Absorption | % | 0.33 | 0.33 | 0.33 | 0.33 | 0.33 |
| | Solder Heat Resistance after Moisture Absorption | | OK | OK | OK | OK | OK |
| | Inner Layer Cu Foil Adhesion Strength | kN/m | 0.74 | 0.74 | 0.74 | 0.74 | 0.74 |
| | IVH Filling Ability | | OK | OK | OK | OK | OK |
| | Transmission Loss | dB/m | −6.0 | −6.0 | −6.0 | −6.0 | −6.0 |

TABLE 2

| | | | EXAMPLE | | | | COMPARATIVE | |
|---|---|---|---|---|---|---|---|---|
| | | | 6 | 7 | 8 | 9 | 1 | 2 |
| PPE Resin Varnish | PPE-1 | Mass Part | 0 | 0 | 0 | 0 | 0 | 0 |
| | | Mn | — | — | — | — | — | — |
| | PPE-2 | Mass Part | 0 | 0 | 0 | 0 | 0 | 0 |
| | | Mn | — | — | — | — | — | — |
| | PPE-3 | Mass Part | 0 | 0 | 70 | 60 | 70 | 70 |
| | | Mn | — | — | 2500 | 2500 | 14000 | 800 |
| | PPE-4 | Mass Part | 0 | 0 | 0 | 0 | 0 | 0 |
| | | Mn | — | — | — | — | — | — |
| | PPE-5 | Mass Part | 70 | 0 | 0 | 0 | 0 | 0 |
| | | Mn | 2500 | — | — | — | — | — |
| | PPE-6 | Mass Part | 0 | 4200 | 0 | 0 | 0 | 0 |
| | | Mn | — | — | — | — | — | — |
| | Unmodified PPE | Mass Part | 0 | 0 | 5 | 50 | | |
| | | Mn | — | — | 14000 | 9000 | | |
| | Crosslinking Curing Agent 1 | kind | TAIC | TAIC | TAIC | TAIC | TAIC | TAIC |
| | | Mass Part | 30 | 30 | 30 | 40 | 30 | 30 |
| | Crosslinking Curing Agent 2 | kind | — | — | — | — | — | — |
| | | Mass Part | — | — | — | — | — | — |
| | Reaction Initiator | Mass Part | 2.5 | 2.5 | 2.5 | 2.5 | 2.5 | 2.5 |
| | Flame Retardant | Mass Part | 20 | 20 | 20 | 20 | 20 | 20 |
| | Inorganic Filler | Mass Part | 14 | 14 | 14 | 14 | 20 | 20 |
| | | av. Diamter (μm) | 3 | 3 | 3 | 3 | 3 | 3 |
| Cu Foil Prepreg | Surface Roughness | μm | 6 | 6 | 6 | 6 | 6 | 6 |
| | Resin Content | % | 55 | 55 | 55 | 55 | 56 | 56 |
| | Resin Fluidity | % | 15 | 11 | 13 | 8 | 2 | 25 |

TABLE 2-continued

| | | | EXAMPLE | | | | COMPARATIVE | |
| --- | --- | --- | --- | --- | --- | --- | --- | --- |
| | | | 6 | 7 | 8 | 9 | 1 | 2 |
| Laminated Sheet | Tg | °C. | 235 | 230 | 230 | 230 | 228 | 152 |
| | Dielectric Constant | | 3.14 | 3.14 | 3.14 | 3.25 | 3.20 | 3.22 |
| | Dielectric Dissipation Factor | | 0.0015 | 0.0014 | 0.0014 | 0.0017 | 0.0014 | 0.0016 |
| | Thermal Expansion Coeff. (Z-axis) | ppm/°C. | 59 | 59 | 59 | 59 | 52 | 62 |
| | Flame Resistance | UL Standard | V-0 | V-0 | V-0 | V-0 | V-0 | V-0 |
| | Cu Foil Adhesion Strength | kN/m | 1.37 | 1.62 | 1.62 | 1.47 | 0.96 | 0.64 |
| | Sec. Processability | | OK | OK | OK | OK | x scratch | x scratch |
| | Moisture Absorption | % | 0.33 | 0.33 | 0.33 | 0.37 | 0.33 | 0.34 |
| | Solder Heat Resistance after Moisture Absorption | | OK | OK | OK | OK | x blister | x blister |
| | Inner Layer Cu Foil Adhesion Strength | kN/m | 0.69 | 0.74 | 0.74 | 0.64 | 0.44 | 0.31 |
| | IVH Filling Ability | | OK | OK | OK | OK | x blister crack | OK |
| | Transmission Loss | dB/m | −6.0 | −6.0 | −6.0 | −6.3 | −6.1 | −6.1 |

As apparent from the results above, it was confirmed that the PPE resin compositions of EXAMPLEs 1 to 4, which are included in the scope of the present invention, have a glass transition point higher than those of the COMPARATIVE EXAMPLEs, wherein the number averaged molecular weight of the PPE used is outside the range specified by the present invention (less than 1,000 or more than 7,000), and are the material suitable for production of multilayer sheets, providing multilayer sheets having an excellent humidity resistance and a solder heat resistances after moisture absorption. Moreover, the laminated sheets of EXAMPLEs, retaining dielectric characteristics almost identical with those of COMPARATIVE EXAMPLEs, have an superior heat resistance (solder heat resistance after moisture absorption), and the PPE resin compositions of EXAMPLEs are superior in processability, especially in resin filling property into IVH than those of the COMPARATIVE EXAMPLEs. In addition, sedimentation of the filler could be significantly suppressed in EXAMPLE 8.

This application is based on Japanese Patent Application No. 2003-19475 filed on Jan. 28, 2003 and No. 2003-136496 filed on May 14, 2003, the contents of which are hereby incorporated by references.

Although the present invention has been fully described by way of example, it is to be understood that various changes and modifications will be apparent to those skilled in the art. Therefore, unless otherwise such changes and modifications depart from the scope of the present invention hereinafter defined, they should be construed as being included therein.

What is claimed is:

1. A laminated sheet prepared by piling a prepreg and copper foil(s) one over the other under heat-pressing,
   wherein the prepreg is prepared by impregnating a poly(phenylene ether) resin composition into a substrate and semi-curing a resulting impregnated substrate,
   wherein the poly(phenylene ether) resin composition comprises a poly(phenylene ether) and a crosslinking curing agent,
   wherein the polyphenylene ether is represented by the following formula (I), and the number averaged molecular weight thereof is in a range of 1,000 to 7,000

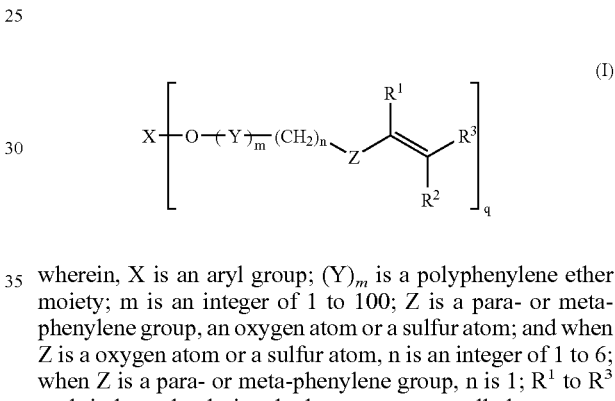

wherein, X is an aryl group; $(Y)_m$ is a polyphenylene ether moiety; m is an integer of 1 to 100; Z is a para- or meta-phenylene group, an oxygen atom or a sulfur atom; and when Z is a oxygen atom or a sulfur atom, n is an integer of 1 to 6; when Z is a para- or meta-phenylene group, n is 1; $R^1$ to $R^3$ each independently is a hydrogen atom, an alkyl group, an alkenyl group or alkynyl group; and q is an integer of 1 to 4.

2. The laminated sheet according to claim 1, wherein said copper foil has a surface roughness of 2 μm or less, and the surface thereof facing the prepreg is treated with zinc or a zinc alloy and at the same time coupled with a silane coupling agent having a vinyl group.

3. The laminated sheet according to claim 1, wherein Z is a para or meta-phenylene group and n is 1.

4. The laminated sheet according to claim 1, wherein Z is an oxygen atom and n is 2.

5. The laminated sheet according to claim 1, wherein $(Y)_m$ is represented by the following formula (II)

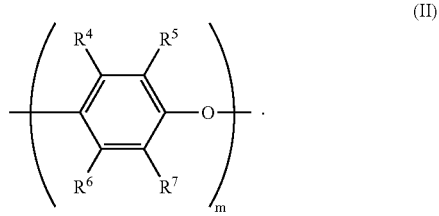

[wherein, $R^4$ to $R^7$ each independently is a hydrogen atom, an alkyl group, an alkenyl group, an alkynyl group or an alkenyl carbonyl group; and m is an integer of 1 to 100.]

6. The laminated sheet according to claim 5, further comprising a poly(phenylene ether) having a number averaged molecular weight in a range of 9,000 to 18,000.

7. The laminated sheet according to claim 1, wherein the portion represented by the following formula is selected from p-ethenylbenzyl and m-ethenylbenzyl groups

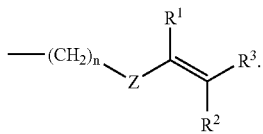

8. The laminated sheet according to claim 1, further comprising a poly(phenylene ether) having a number averaged molecular weight in a range of 9,000 to 18,000.

9. The laminated sheet according to claim 1, wherein the mass ratio represented by [the poly(phenylene ether)]/(the crosslinking curing agent) is 30/70 to 90/10.

10. The laminated sheet according to claim 1, further comprising a poly(phenylene ether) having a number averaged molecular weight in a range of 9,000 to 18,000.

11. The laminated sheet according to claim 1, wherein both p-ethenylbenzyl and m-ethenylbenzyl groups are present.

12. The laminated sheet according to claim 1, wherein said crosslinking curing agent is trialkenyl isocyanurate.

13. The laminated sheet according to claim 1, wherein said crosslinking curing agent is a tri- to penta-functional (meth) acrylate compound.

14. The laminated sheet according to claim 1, further comprising at least one kind of organic or inorganic filler.

15. The laminated sheet according to claim 14, wherein said filler has an average diameter of 10 μm or less.

16. The laminated sheet according to claim 14, wherein said filler is a hollow substance.

17. The laminated sheet according to claim 14, wherein said filler is a substance prepared from a fluorine-containing compound.

18. The laminated sheet according to claim 1, further comprising a flame retardant.

19. The laminated sheet according to claim 18, wherein said flame retardant is a bromine compound having a bromine content of 8 to 20 mass % with respect to the total amount of the composition.

* * * * *

UNITED STATES PATENT AND TRADEMARK OFFICE
CERTIFICATE OF CORRECTION

| | | |
|---|---|---|
| PATENT NO. | : 7,413,791 B2 | Page 1 of 1 |
| APPLICATION NO. | : 10/718525 | |
| DATED | : August 19, 2008 | |
| INVENTOR(S) | : H. Inoue et al. | |

It is certified that error appears in the above-identified patent and that said Letters Patent is hereby corrected as shown below:

At column 21, line 16 (claim 8, line 1), "claim 1" should be --claim 7--.

Signed and Sealed this

Seventh Day of April, 2009

JOHN DOLL
*Acting Director of the United States Patent and Trademark Office*